United States Patent [19]

Yagiu et al.

[11] Patent Number: 5,046,798
[45] Date of Patent: Sep. 10, 1991

[54] SEMICONDUCTOR LIGHT EMITTING DEVICE AND APPARATUS USING THE SAME

[75] Inventors: Yasutoshi Yagiu; Tetsuo Kumazawa, both of Ibaraki; Makoto Shimaoka, Ushiku; Kunio Aiki, Komoro, all of Japan

[73] Assignee: Hitachi, Ltd., Tokyo, Japan

[21] Appl. No.: 387,984

[22] Filed: Aug. 1, 1989

[30] Foreign Application Priority Data

Aug. 11, 1988 [JP] Japan .................. 63-200622

[51] Int. Cl.$^5$ ................. G02B 6/36; G02B 7/26
[52] U.S. Cl. ........................ 350/34; 350/49; 350/92
[58] Field of Search ............ 350/96.18, 432, 433, 350/96.17, 96.20

[56] References Cited

U.S. PATENT DOCUMENTS

| 4,102,559 | 7/1978 | Hunzinger | 350/96.18 |
| 4,307,934 | 12/1981 | Palmer | 350/96.18 |
| 4,722,593 | 2/1988 | Shimazaki | 350/432 |
| 4,744,620 | 5/1988 | Ueno et al. | 350/96.18 |
| 4,749,250 | 6/1988 | Carter | 350/96.18 |
| 4,790,618 | 12/1988 | Abe | 350/96.18 |

Primary Examiner—William L. Sikes
Assistant Examiner—Robert E. Wise
Attorney, Agent, or Firm—Antonelli, Terry, Stout & Kraus

[57] ABSTRACT

A collimated-beam generating device using a semiconductor laser includes a two-lens system in which light converged by a first lens is converted into a collimated beam by a second lens, whereby a distance between the semiconductor laser and the first lens is made large, assembly of the device is made easy, and a collimated beam having a small beam diameter can be produced.

13 Claims, 2 Drawing Sheets

SEMICONDUCTOR LIGHT EMITTING DEVICE AND APPARATUS USING THE SAME

BACKGROUND OF THE INVENTION

The present invention relates to a semiconductor light emitting device and an apparatus using the same, and more particularly to a semiconductor light emitting device in which a light emitting element such as a semiconductor laser or a light emitting diode is used, the assemblage and adjustment are simple or easy and a collimated beam having a small beam diameter can be generated.

In the conventional semiconductor light emitting device, as shown in FIG. 5, a light emitting element 1 is disposed at a focal point or position of one lens 2 to produce a collimated beam 4. The prior art relevant to this type of device includes the Institute of Electronics, Information and Communication Engineers of Japan, Omnibus National Convention, No. 2452, Spring 1987 and the Institute of Electronics, Information and Communication Engineers of Japan, National Convention on Semiconductors and Materials Departments, No. 319, Autumn 1987. In the conventional device shown in FIG. 5, the beam diameter d of the collimated beam 4 is $$d = 2 \cdot f \cdot \tan \theta \tag{1}$$

provided that the divergence angle of the light emitted by the light emitting element 1 is $2\theta$ and the focal lens of the length 2 is f. In general, the collimated beam has a higher utility value the narrower it is. Especially in the case where the collimated beam is used in an optical fiber communication system, the beam diameter not larger than 1 mm is frequently required.

However, if the beam diameter is made small, it is apparent from the equation (1) that the focal length of the lens 2 or a distance between the light emitting element 1 and the lens 2 required becomes small so that the positioning (or location) and fixing of the light emitting element 1 and the lens 2 becomes difficult. For example, in the case where a semiconductor laser having a wavelength of 1.54 $\mu$m is used as the light emitting element 1 and a small or minute spherical lens made of $TaF_3$ glass is used as the lens 2, a focal length f equal to about 0.6 mm is required to produce a collimated beam having a beam diameter of 1 mm when the half angle $\theta$ of divergence of the emitted light is typically 40°.

On the other hand, the radius r and focal length f of a spherical lens have therebetween a relation of $$r = 2 \cdot f \cdot (n-1)/n \tag{2}$$

where n is the refractive index of the lens. By introducing f=0.6 mm and n=1.78 (the refractive index of $TaF_3$ glass at the wavelength 1.54 $\mu$m) into the equation (2), we obtain r≈0.53 mm. In the case of the spherical lens, the focal length f is a distance from the focal point to the center of the spherical lens. Accordingly, a distance l from the focal point to the end surface of the spherical lens is expressed by $$l = f - r = (2-n) \cdot f/n \tag{3}$$

by virtue of the equation (2). By introducing f=0.6 mm and n=1.78 into the equation (3), we obtain l≈0.07 mm.

To fix the semiconductor laser 1 and the spherical lens 2 with their optical axes aligned with each other is a very difficult task. Also, there is a high possibility that the lens 2 or an operating jig will touch the semiconductor laser 1 during the fixing work, thereby damaging the semiconductor laser 1. Further, a tolerance for positional deviation of parts which may take place in fixing the parts by means of adhesive or solder becomes small.

SUMMARY OF THE INVENTION

An object of the present invention is to provide a semiconductor light emitting device and applied apparatuses thereof in which a distance between a light emitting element and a lens can be made large and the diameter of a collimated beam produced can be made small.

This object can be achieved by replacing the conventional lens system with a single lens group by a lens system with two lens groups or by constructing the overall lens system with a light emitting element, a first lens group for converging light from the light emitting element, and a second lens group disposed with a focal point thereof aligned with a converging point of the first lens group for converting the converged light into a collimated light beam.

Namely, in order to attain the above object, the present invention proposes a semiconductor light emitting device comprising a semiconductor light emitting element, a first lens for converging light from the semiconductor light emitting element, and a second lens disposed with a focal point thereof aligned with a converging point of the first lens for converting the converged light into a collimated beam.

More particularly, there is provided a semiconductor light emitting device comprising a semiconductor light emitting element mounted on a stem, a sealing cap having a central aperture covered by a glass window and fixed to the stem to cover the semiconductor light emitting element, a first lens for converging light from the semiconductor light emitting element through the glass window of the sealing cap, a second lens for converting the light converged by the first lens into a collimated beam, and a cylindrically-shaped lens holder fixed onto the sealing cap and having a central aperture in which the first and second lenses are held such that their optical axes are aligned with each other.

The semiconductor light emitting element may be a semiconductor laser or a light emitting diode.

According to the above-mentioned construction, it is possible to make a distance between the light emitting element and the first lens not smaller than 0.5 mm and to make the diameter of the collimated beam after it passes through the second lens not larger than 1 mm.

The semiconductor light emitting device having the above-mentioned construction can be applied to an optical transmission module in which the collimated beam is introduced into an optical fiber or an optical isolator or an optical transmission module in which the collimated beam is introduced into an optical isolator and is thereafter introduced into an optical fiber directly or through a lens.

The semiconductor light emitting device can also be used as a light source for a head for a compact disc apparatus, a laser machining apparatus, an optical interferometer or the like.

Light emitted from the light emitting element is converged by the first lens. Since the second lens is disposed so that the focal point thereof coincides with the converging point of the first lens, the light diverges again and is incident upon the second lens to be converted into a collimated beam. According to such an arrangement, since the light emitting element can be disposed at a position far from a focal distance of the first lens, a distance between the light emitting element and the first lens can be made large. Also, by using a short-focus lens as the second lens, a collimated beam having a small diameter can be produced.

According to the present invention, there is obtained a semiconductor light emitting device in which a distance between a light emitting element and a lens is large or the assemblage is easy and a collimated beam having a small diameter can be generated.

DESCRIPTION OF THE PREFERRED EMBODIMENTS

Figure 1:
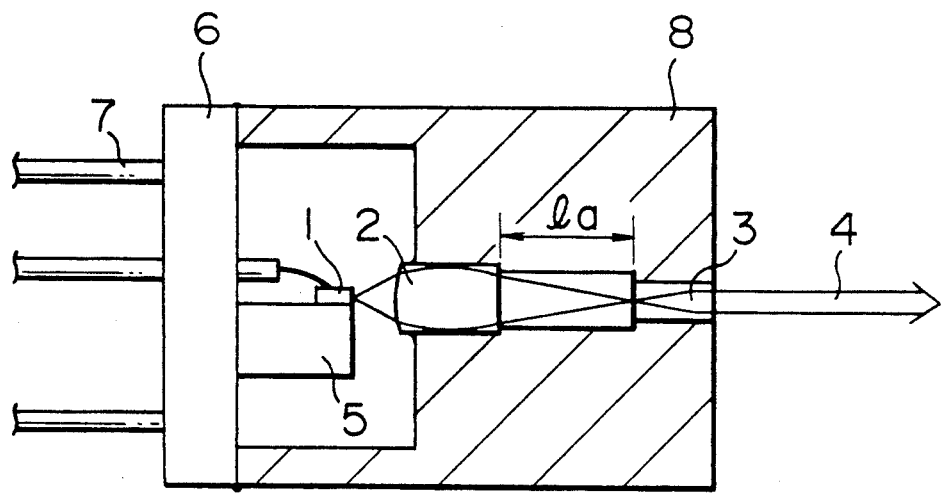
FIG. 1 is a cross section showing a fundamental embodiment of the semiconductor light emitting device according to the present invention.

A fundamental embodiment of the present invention will now be explained with reference to FIG. 1.

A semiconductor laser having a wavelength of 1.56 μm is used as a light emitting element 1. Reference numeral 5 represents a heat sink for supporting the light emitting element 1. Reference numeral 7 represents lead wires for supplying with electric current. Each of first and second lenses 2 and 3 is a GRIN (graded index) rod lens which has less aberration than a spherical lens and is easy to fix. Particularly, the second lens 2 includes a plano-convex GRIN rod lens the aberration of which is further reduced. The dimensions of the first and second lenses 2 and 3 are as follows:

first lens 2

| refractive index on optical axis: | $n_2 = 1.634$ |
| --- | --- |
| Refractive index distribution constant: | $\sqrt{A_2} = 0.417 \text{ mm}^{-1}$ |
| radius of plano-convex: | $R = 2 \text{ mm}$ |
| lens length: | $Z_2 = 2.93 \text{ mm}$ |
| lens diameter: | $d_2 = 1.8 \text{ mm}$ | second lens 3

| refractive index on optical axis: | $n_3 = 1.59$ |
| --- | --- |
| refractive index distribution constant: | $\sqrt{A_3} = 0.596 \text{ mm}^{-1}$ |
| lens length: | $Z_3 = 2.64 \text{ mm}$ |
| lens diameter: | $d_3 = 1.0 \text{ mm}$ |

A distance $l_1$ between the light emitting element 1 and the first lens 2 is selected to be equal to 1 mm with a margin for error in order to facilitate the assemblage.

Light emitted from the light emitting element 1 is converged by the first lens 2. Based on the property of the plano-convex GRIN rod lens, a distance $l_a$ from the right end surface of the first lens 2 to the converging point thereof is given by $$l_a = \frac{n_2 \cdot \sqrt{A_2} \cdot l_1 \cdot \cos(\sqrt{A_2} \cdot Z_2) - (1 + P \cdot l_1)\sin(\sqrt{A_2} \cdot Z_2)}{n_2{}^2 \sqrt{A_2}{}^2 \cdot l_1 \cdot \sin(\sqrt{A_2} \cdot Z_2) + n_2 \cdot \sqrt{A_2} \cdot (P \cdot l_1 - 1)\cos(\sqrt{A_2} \cdot Z_2)} \quad (4)$$

where $P = (n_2 - 1)/R$. By introducing the numerical values into the equation (4), we obtain $l_a = 3.16$ mm.

The second lens 3 has a pitch $\sqrt{A_3} \cdot Z_3/2\pi = 0.25$ and is designed such that a focal point thereof is positioned at an end surface of the lens. In order to make the converging point of the first lens 2 and the focal point of the second lens 3 coincident with each other, a distance $l_2$ between the lens 2 and the lens 3 is made equal to $l_a$ or is selected to be equal to 3.16 mm.

The beam diameter d and divergence angle $\theta_b$ of a collimated beam 4 from the second lens 3 can be approximated by $$d = 2\Delta \quad (5)$$

and $$\theta_b = \tan^{-1}\Delta_b \quad (6)$$

where $\Delta$ is a deviation from the optical axis when light rays from the outermost edge of the first lens 2 emanate from the second lens 3 after they pass through the second lens 3, and $\Delta_b$ is the gradient of the light rays emanated from the second lens 3 with respect to the optical axis. Based on the property of the GRIN rod lens, $\Delta$ and $\Delta_b$ are given by:

$$\Delta = \frac{1}{n_3 A_3} \sin(\sqrt{A_3} \cdot Z_3) \frac{d_2}{2l_2} \quad (7)$$

and $$\Delta_b = \left| \cos(\sqrt{A_3} \cdot Z_3) \frac{d_2}{2l_2} \right| \quad (8)$$

By introducing the numerical values into the equations (5), (6), (7) and (8), we obtain d = 0.60 mm and $\Delta_b = 0.043°$. Accordingly, the present device can provide a collimated beam which is narrow (beam diameter of 0.6 mm) and has a small divergence angle (beam divergence angle of 0.043°).

Next, explanation will made of a method of fabricating the device.

A first GRIN rod lens 2 and a second GRIN rod lens 3 are inserted into a central aperture of a cylindrically-shaped lens holder 8 made of SUS304 with their optical axes aligned with each other and are fixed in an arrangement satisfying the above-mentioned distance relations. In that case, the preliminarily metallized side surfaces of the rod lenses 2 and 3 are fixed to the lens holder 8 by means of solder.

Next, the lens holder 8 is placed to cover a light emitting element 1 and is jointed to a stem 6. The length of a leg of the lens holder 8 is selected such that a distance $l_1$ between the light emitting element 1 and the first lens 2 satisfy the above-mentioned design specification $l_1 = 1$ mm. The light emitting element 1 is excited to emit light which in turn is passed through the lenses 2 and 3. While observing a colliminated beam emanating from the lens 3 by a remote or distant photodetector or television camera, the lens holder 8 is moved parallel to the stem 6 to perform adjustment for aligning the light emitting element 1 with the optical axis of the lenses 2 and 3. At a position where the collimated beam 4 becomes most perpendicular to the stem 6, the lens holder 8 and the stem 6 are fixed to each other through welding or by means of solder, organic adhesive, glass having a low melting point, or the like. Since the distance 1 between the light emitting element 1 and the first lens 2 is made large or selected to be 1 mm, a possibility that the light emitting element 1 may be damaged due to a touch thereon during fabrication of the device is less.

Though the GRIN rod lens has been used as each of the lenses 2 and 3 in the foregoing embodiment, a spherical lens, an ordinary rod lens, or a lens group including a plurality of lens elements may be used to provide a device having a similar characteristic. Also, as the material for fixing the lenses, organic adhesive or glass having a low melting point can be used instead of the solder which has been used in the embodiment.

Figure 2:
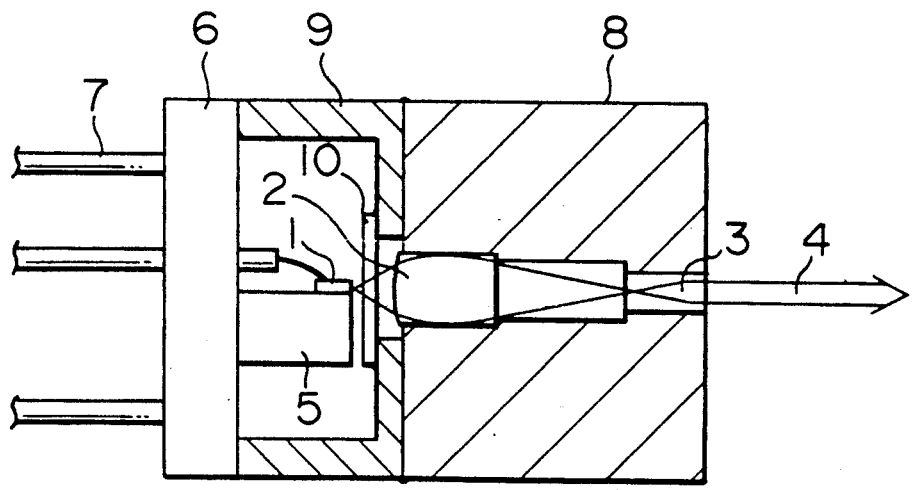
FIG. 2 is a cross section showing another embodiment of the semiconductor light emitting device according to the present invention.

Another embodiment of the present invention is shown in FIG. 2. First, a metal cap 9 having a glass window 10 of 0.3 mm thickness fixed thereto by means of glass having a low melting point is placed to cover a light emitting element 1 and is jointed and resistance-welded to a stem 6. Next, a lens holder 8 having fixed lenses 2 and 3 therein is positioned or located onto the cap 9 in a similar manner as mentioned before and is thereafter fixed by means of laser-welding, solder, glass having a low melting point, organic adhesive, or the like.

In the case of this structure, since the cap 9 is resistance-welded to the stem 6, the reliability of hermetic sealing is improved as compared with the case of the embodiment shown in FIG. 1.

In general, resistance-welding involves a positional deviation of several tens of microns upon welding. Therefore, the resistance-welding cannot be used for fixing of the lens holder 8 in the embodiment of FIG. 1 since the light emitting element 1 will deviate from the optical axis of the lenses 2 and 3. On the other hand, in the case of the embodiment shown in FIG. 2, the resistance-welding can be used as a method of fixing the cap 9.

Figure 3:
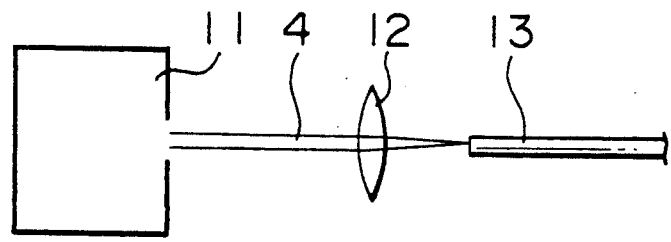
FIGS. 3 and 4 are views of optical transmission modules in which the semiconductor light emitting device according to the present invention is used.
Figure 4:
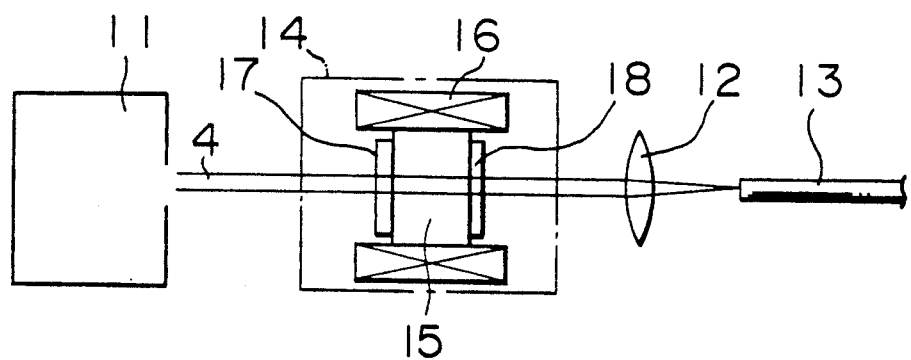
Figure 5:
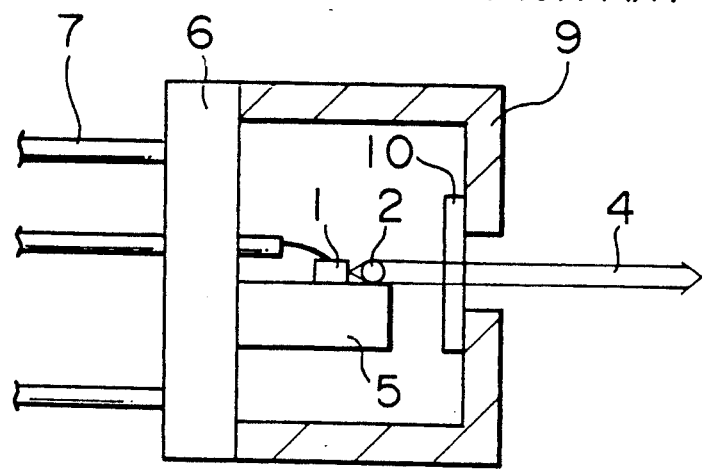
FIG. 5 is a cross section showing an example of the conventional semiconductor light emitting device.

Embodiments of an optical transmission module in which the semiconductor light emitting device according to the present invention is used to transmit light to an optical fiber 13 are shown in FIGS. 3 and 4.

The embodiment shown in FIG. 3 in constructed such that a collimated beam 4 generated from a collimated-beam producing device 11 (having the structure shown in FIG. 1 or 2) is converged by a lens 12 and is made incident upon an end surface of an optical fiber 13 disposed at the converging point of the lens 12.

The optical transmission module of the embodiment shown in FIG. 4 has a structure in which an optical isolator 14 is interposed between the collimated-beam producing device 11 (having the structure shown in FIG. 1 or 2) and the optical fiber 13 so that light reflected from the end surface of the optical fiber 13 is prevented from returning to the light emitting element 1 which is a light source. The optical isolator 14 has a structure in which a Faraday rotator 15 made of a cylindrically-shaped or worked YIG ($Y_3Fe_5O_{12}$) crystal, a polarizer 17 and an analyzer 18 are disposed in a hollow portion of a cylindrical permanent magnet 16. Each of the polarizer 17 and the analyzer 18 includes a cylinder plate made of calcite and they are fixed to opposite end surfaces of the Faraday rotator 15 through press-adhesion.

In the foregoing embodiments, a long-wavelength semiconductor laser for optical communication has bee used as the light emitting element. However, if a short-wavelength semiconductor laser is used, the light emitting device according to the present invention can be applied to a head for a compact disc apparatus. Also, if a large-power semiconductor laser is used, the light emitting device according to the present invention can be applied to a laser machining apparatus. Further, the light emitting device according to the present invention can be used as a light sources in various optical measurement equipment, for example, an optical interferometer, in order to improve the quality of the light source.

We claim:

1. A semiconductor light emitting device comprising:
   a semiconductor light emitting element;
   a first lens for converging light from said semiconductor light emitting element; and
   a second lens disposed with a focal position thereof aligned with the converging point of said first lens for converting the converged light into a collimated beam.

2. A semiconductor light emitting device according to claim 1, wherein said semiconductor light emitting element includes a semiconductor laser.

3. A semiconductor light emitting device according to claim 1, wherein said semiconductor light emitting element includes a light emitting diode.

4. A semiconductor light emitting device according to claim 1, wherein a distance between said light emitting element and said first lens is not smaller than 0.5 mm, and wherein a diameter of the collimated beam after it passes through said second lens is not larger than 1 mm.

5. An optical transmission module comprising a semiconductor light emitting device according to claim 1, and one of an optical fiber and an optical isolator, wherein said collimated beam is made incident upon said one of an optical fiber and an optical isolator.

6. An optical transmission module comprising a semiconductor light emitting device according to claim 1, an optical isolator, and an optical fiber, wherein said collimated beam is made incident upon said optical isolator and is thereafter made incident upon said optical fiber one of directly and through a lens.

7. A semiconductor light emitting device comprising:
   a semiconductor light emitting element;
   a first lens for converging light emitted from the semiconductor light emitting element to a converging point; and
   a second lens for converting the converged light into a collimated beam, the second lens being disposed such that a focal point thereof is located at the converging point.

8. A semiconductor light emitting device comprising:
   a semiconductor light emitting element mounted on a stem;
   a sealing cap having a central aperture covered by a glass window and fixed to said stem to cover said semiconductor light emitting element;

a first lens for converging light from said semiconductor light emitting element through said glass window of said sealing cap;

a second lens for converting the light converged by said first lens into a collimated beam; and a cylindrically-shaped lens holder fixed onto said sealing cap and having a central aperture in which said first and second lenses are held such that their optical axes are aligned with each other.

9. A semiconductor light emitting device according to claim 8, wherein said semiconductor light emitting element includes a semiconductor laser.

10. A semiconductor light emitting device according to claim 8, wherein said semiconductor light emitting element includes a light emitting diode.

11. A semiconductor light emitting device according to claim 8, wherein a distance between said light emitting element and said first lens is not smaller than 0.5 mm, and wherein a diameter of the collimated beam after it passes through said second lens is not larger than 1 mm.

12. An optical transmission module comprising a semiconductor light emitting device according to claim 8, and one of an optical fiber and an optical isolator, wherein said collimated beam is made incident upon said one of an optical fiber and an optical isolator.

13. An optical transmission module comprising a semiconductor light emitting device according to claim 8, an optical isolator, and an optical fiber, wherein said collimated beam is made incident upon said optical isolator and is thereafter made incident upon said optical fiber one of directly and through a lens.

* * * * *